US011315956B2

(12) United States Patent
Zang et al.

(10) Patent No.: US 11,315,956 B2
(45) Date of Patent: Apr. 26, 2022

(54) ARRAY SUBSTRATE, MANUFACTURING METHOD THEREOF AND DISPLAY PANEL (71) Applicants: BOE TECHNOLOGY GROUP CO., LTD., Beijing (CN); Chengdu BOE Optoelectronics Technology Co., Ltd., Sichuan (CN)

(72) Inventors: Pengcheng Zang, Beijing (CN); Shan Gao, Beijing (CN); Yuanjie Xu, Beijing (CN)

(73) Assignees: BOE Technology Group Co., LTD, Beijing (CN); Chengdu BOE Optoelectronics Technology Co., LTD, Chengdu (CN)

(*) Notice: Subject to any disclaimer, the term of this patent is extended or adjusted under 35 U.S.C. 154(b) by 594 days.

(21) Appl. No.: 16/309,082

(22) PCT Filed: Apr. 20, 2018

(86) PCT No.: PCT/CN2018/083983
§ 371 (c)(1),
(2) Date: Dec. 11, 2018

(87) PCT Pub. No.: WO2019/007136
PCT Pub. Date: Jan. 10, 2019

(65) Prior Publication Data
US 2021/0013232 A1 Jan. 14, 2021

(30) Foreign Application Priority Data
Jul. 3, 2017 (CN) .......................... 201710534097.8

(51) Int. Cl.
H01L 27/12 (2006.01)
G02F 1/1362 (2006.01)
G02F 1/1368 (2006.01)

(52) U.S. Cl.
CPC .......... H01L 27/124 (2013.01); G02F 1/1368 (2013.01); G02F 1/136286 (2013.01); H01L 27/127 (2013.01)

(58) Field of Classification Search
CPC . H01L 27/124; H01L 27/127; H01L 27/1222; H01L 27/1214
See application file for complete search history.

(56) References Cited

U.S. PATENT DOCUMENTS 9,761,731 B2 9/2017 Long et al.
2016/0293771 A1 10/2016 Long et al.
(Continued)

FOREIGN PATENT DOCUMENTS

| CN | 106252217 A | 12/2016 |
| CN | 107134463 A | 9/2017 |
| EP | 3 185 305 A1 | 6/2017 |

OTHER PUBLICATIONS

International Search Report and Written Opinion dated Jul. 11, 2018, from application No. PCT/CN2018/083983.

Primary Examiner — Tucker J Wright
(74) Attorney, Agent, or Firm — Arch & Lake LLP (57) ABSTRACT The present disclosure provides an array substrate, a method of manufacturing the same, and a display panel. The array substrate includes a base substrate, a thin film transistor disposed at a side of the base substrate. The thin film transistor includes a first electrode, a second electrode, and a gate electrode. The array substrate includes a data line disposed at the side of the base substrate The array substrate includes a connection electrode electrically connecting the first electrode of the thin film transistor to the data line. An orthographic projection of an active layer of the thin film transistor on the base substrate is located within an ortho- (Continued)

graphic projection of the gate electrode of the thin film transistor on the base substrate.

6 Claims, 10 Drawing Sheets

(56) References Cited

U.S. PATENT DOCUMENTS

| | | | |
|---|---|---|---|
| 2016/0322404 A1* | 11/2016 | Jiang | H01L 29/78669 |
| 2018/0061870 A1* | 3/2018 | Yang | H01L 29/66969 |
| 2018/0097053 A1* | 4/2018 | Park | H01L 27/3262 |

* cited by examiner

ARRAY SUBSTRATE, MANUFACTURING METHOD THEREOF AND DISPLAY PANEL

CROSS-REFERENCE TO RELATED APPLICATIONS

The present application is based upon International Application No. PCT/CN2018/083983, filed on Apr. 20, 2018, which claims the priority to the Chinese Patent Application NO. 201710534097.8, entitled "ARRAY SUBSTRATE AND MANUFACTURING METHOD THEREOF, DISPLAY PANEL", filed on Jul. 3, 2017, the entire contents of which are hereby incorporated by reference.

TECHNICAL FIELD

The present disclosure relates to the field of display technology, and more particularly, to an array substrate, a manufacturing method thereof and a display panel.

BACKGROUND

In order to save costs, the number of masks used in pixel design should be reduced as much as possible. For example, a widely used method is to form a source electrode, a drain electrode, and an active layer with the same halftone mask (HTM MASK) to reduce the number of masks.

However, this method generally causes an increase in leakage current of a thin film transistor (TFT) to deteriorate the performance of the TFT. Therefore, the current manufacturing method of the array substrate still needs to be improved.

SUMMARY

Arrangements of the present disclosure relate to an array substrate, a method of manufacturing the same, and a display panel.

In a first aspect of the present disclosure, there is provided an array substrate.

According to an arrangement of the present disclosure, the array substrate includes a base substrate, a thin film transistor disposed at a side of the base substrate. The thin film transistor includes a first electrode, a second electrode, and a gate electrode. The array substrate includes a data line disposed at the side of the base substrate. The array substrate includes a connection electrode, electrically connecting the first electrode of the thin film transistor to the data line. An orthographic projection of an active layer of the thin film transistor on the base substrate is located within an orthographic projection of the gate electrode of the thin film transistor on the base substrate.

According to an arrangement of the present disclosure, the connection electrode is formed of ITO material.

According to an arrangement of the present disclosure, the data line is disposed in a same layer as the first electrode and the second electrode.

According to an arrangement of the present disclosure, the data line is disposed in a same layer as the gate electrode.

According to an arrangement of the present disclosure, the connection electrode includes a first sub-connection electrode disposed in a same layer as a pixel electrode and electrically connected to the first electrode. The connection electrode includes a second sub-connection electrode disposed in a same layer as a common electrode, and electrically connected to the first sub-connection electrode and the data line.

According to an arrangement of the present disclosure, the data line includes a first data line disposed in a same layer as the first electrode and the second electrode. The data line includes a second data line disposed in a same layer as the gate electrode, and electrically connected to the first data line through the connection electrode.

According to an arrangement of the present disclosure, the connection electrode includes a third sub-connection electrode disposed in a same layer as a pixel electrode and electrically connected to the first electrode. The connection electrode includes a fourth sub-connection electrode, disposed in a same layer as a common electrode, and electrically connected to the third sub-connection electrode, the first data line, and the second data line.

In a second aspect of the present disclosure, there is provided a manufacturing method of an array substrate.

According to an arrangement of the present disclosure, the method includes forming a thin film transistor at a side of a base substrate. The thin film transistor includes a first electrode, a second electrode and a gate electrode. An orthographic projection of an active layer of the thin film transistor on the base substrate is located within an orthographic projection of the gate electrode of the thin film transistor on the base substrate. The method includes forming a data line at the side of the base substrate. The method includes forming a connection electrode at a side of the first electrode of the thin film transistor and the data line away from the base substrate. The connection electrode electrically connects the first electrode to the data line.

According to an arrangement of the present disclosure, the data line, the first electrode, the second electrode and the active layer are formed by one patterning process.

According to an arrangement of the present disclosure, the data line and the gate electrode are formed by one patterning process; and the first electrode, the second electrode and the active layer are formed by one patterning process.

According to an arrangement of the present disclosure, the connection electrode includes a first sub-connection electrode and a second sub-connection electrode. The first sub-connection electrode is formed along with the pixel electrode by one patterning process to be electrically connected to the first electrode. The second sub-connection electrode is formed along with the common electrode by one patterning process to be electrically connected to the first sub-connection electrode and the data line.

According to an arrangement of the present disclosure, the data line includes a first data line and a second data line. The first data line is formed along with the first electrode, the second electrode, and the active layer by one patterning process. The second data line is formed along with the gate electrode by one patterning process.

According to an arrangement of the present disclosure, the connection electrode comprises a third sub-connection electrode and a fourth sub-connection electrode. The third sub-connection electrode is formed along with the pixel electrode by one patterning process to be electrically connected to the first electrode. The fourth sub-connection electrode is formed along with the common electrode by one patterning process to be electrically connected to the third sub-connection electrode, the first data line and the second data line.

In a third aspect of the present disclosure, there is provided a display panel.

According to an arrangement of the present disclosure, the display panel includes the above described array substrate.

The additional aspects and advantages of the present disclosure in part will be set forth in the description which follows, in part will become apparent in the description which follows, or will be understood through the practice of the present disclosure.

BRIEF DESCRIPTION OF THE DRAWINGS

The above and/or additional aspects and advantages of the present disclosure will become apparent and readily understood from the description of the arrangements in conjunction with the drawing below.

FIG. 1b is a schematic cross-sectional view of a structure taken along line BB' of FIG. 1a;

FIG. 1c is a schematic cross-sectional view of a structure taken along line CC' of FIG. 1a;

FIG. 2 is a schematic diagram showing the principle of generating a leakage current in a TFT of the array substrate of FIG. 1a;

FIG. 3b is a schematic cross-sectional view of a structure taken along line CC' of FIG. 3a;

FIG. 3c is a schematic cross-sectional view of a structure taken along line EE' of FIG. 3a;

FIG. 4b is a schematic cross-sectional view of a structure taken along line CC' of FIG. 4a;

FIG. 4c is a schematic cross-sectional view of a structure taken along line EE' of FIG. 4a;

FIG. 5b is a schematic cross-sectional view of a structure taken along line CC' of FIG. 5a;

FIG. 5c is a schematic cross-sectional view of a structure taken along line EE' of FIG. 5a;

FIG. 6b is a schematic cross-sectional view of a structure taken along line BB' of FIG. 6a;

FIG. 6c is a schematic cross-sectional view of a structure taken along line CC' of FIG. 6a;

FIG. 7b is a schematic cross-sectional view of a structure taken along line BB' of FIG. 7a;

FIG. 7c is a schematic cross-sectional view of a structure taken along line CC' of FIG. 7a;

FIG. 8b is a schematic cross-sectional view of a structure taken along line BB' of FIG. 8a;

FIG. 8c is a schematic cross-sectional view of a structure taken along line CC' of FIG. 8a;

DETAILED DESCRIPTION

The arrangements of the present disclosure are described in details below, and those skilled in the art will understand that the following arrangements are intended to be illustrative of the present disclosure, instead of being limitation of the present disclosure. Unless specifically stated otherwise, the following arrangements, in which the specific techniques or conditions are not explicitly described, may be implemented by those skilled in the art according to the commonly used techniques or conditions in the art or according to the product specifications. The used reagents or instruments which are not indicated with manufacturer are all commercially available conventional products.

Generally, when a source electrode, drain electrode and active layer are formed by the same halftone mask (HTM MASK), the active layer is formed under the source electrode and the drain electrode, for example, referring to FIGS. 1a to 1d and FIG. 2. In this case, with particular reference to the three channel positions (I, II, III) shown in FIG. 2, the active layer under the source electrode and drain electrode is formed to extend beyond the area where the gate electrode is located. When illumination hv is performed, referring to FIG. 2, the characteristic of the active layer 400 outside the gate electrode 200 may be changed, and holes at the source electrode 501 are increased with illumination, resulting in an increase in leakage current of the thin film transistor (TFT). The switching characteristic of the TFT is affected, and the voltage of the drain electrode is close to the voltage of the source electrode, resulting in an abnormal display.

The inventors of the present application discovered during research that in order to prevent the above-mentioned increase in TFT leakage current caused by the use of HTM MASK to prepare a display panel, two sets of masks may be used to form the source electrode, drain electrode and active layer, respectively. This can effectively solve the problem of leakage current, but it will increase the cost of production.

The inventors of the present application further discovered during research that, when the source electrode or drain electrode is connected to a data line through a connection electrode at a climbing position of the source electrode with respect to the gate electrode at the channel in FFS pixel design in the related art, such that the active layer is not extended beyond the area where the gate electrode is located, the leakage current generated in the TFT when being illuminated with light may be reduced and at the same time the manufacturing cost will not be increased.

In view of this, arrangements of the present disclosure provide an array substrate having low manufacturing cost, reduced leakage current due to an active layer extending beyond a gate electrode and higher display quality, a method of manufacturing the same, and a display panel including the same.

In an aspect of the present disclosure, an array substrate is provided. The array substrate of the arrangements of the present disclosure will be described in detail with reference to FIGS. 3a to 8d.

Figure 1A:
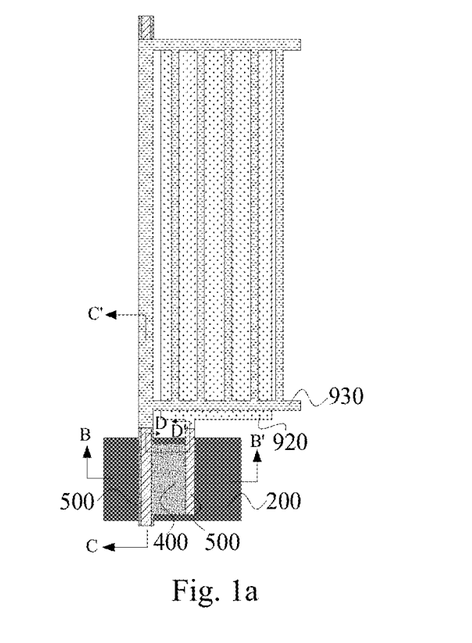
FIG. 1a is a schematic top view of a structure of an array substrate.
Figure 1B:
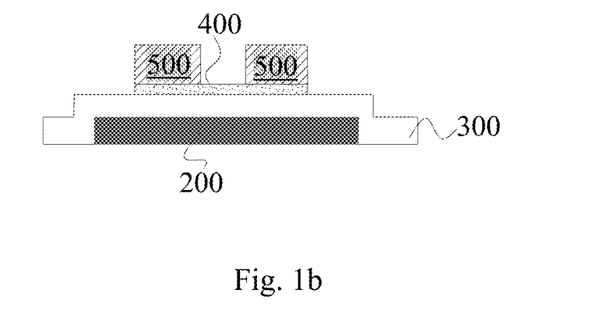
Figure 1C:
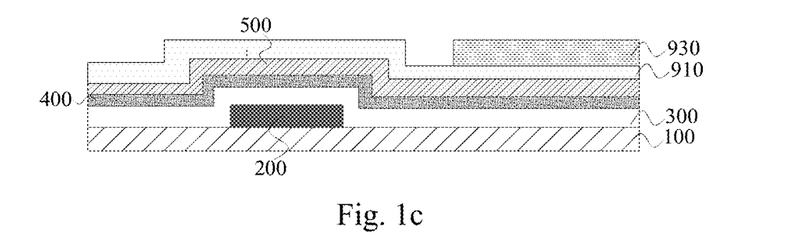
Figure 1D:
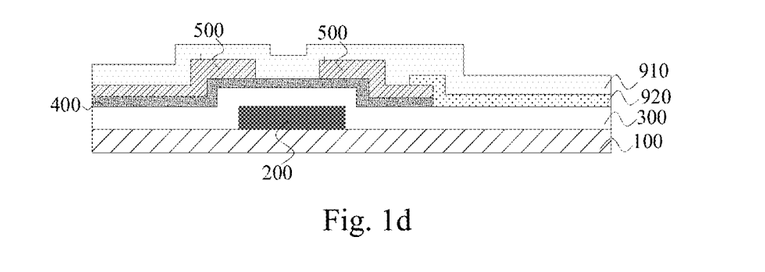
FIG. 1d is a schematic structure view obtained after a U-shaped cross-section taken along line DD' of FIG. 1a is unfolded.
Figure 2:
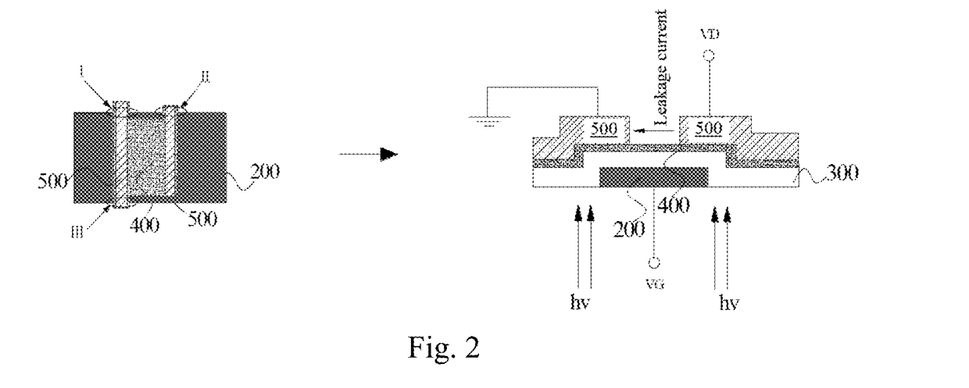
Figure 3A:
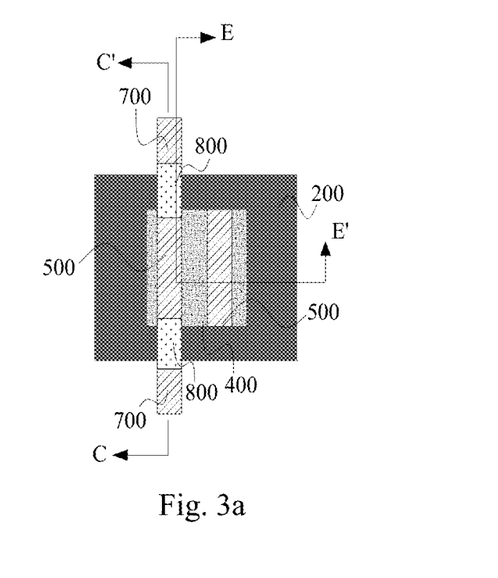
FIG. 3a is a schematic top view of a structure of an array substrate of an arrangement of the present disclosure.
Figure 3B:
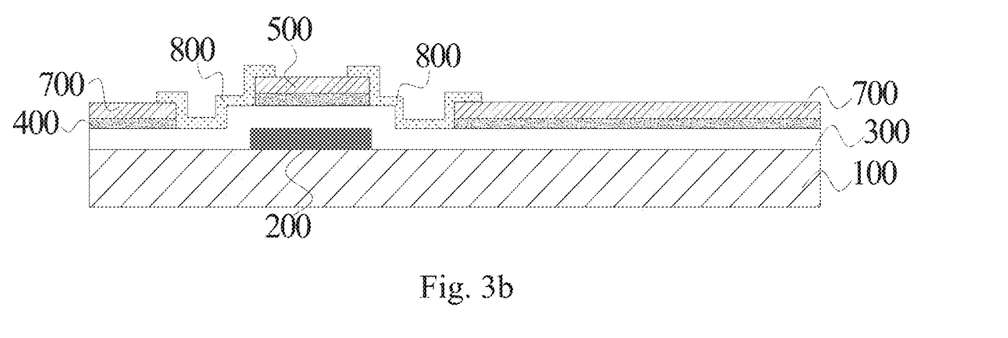
Figure 3C:
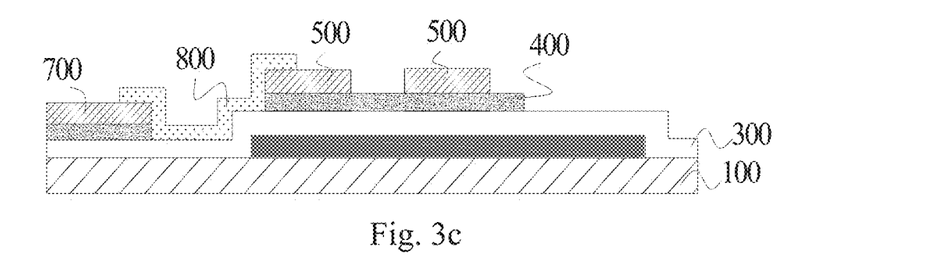

According to an arrangement of the present disclosure, the array substrate includes a substrate 100, a thin film transistor, a data line 700, and a connection electrode 800. The thin film transistor is disposed at a side of the base substrate 100, and the data line 700 is disposed at the same side of the base substrate 100. Referring to FIG. 3b, the thin film transistor includes a gate electrode 200, a gate insulating layer 300, an active layer 400, a first electrode, and a second electrode. The first electrode and the second electrode are respectively a source electrode and a drain electrode, which are collectively referred to herein as source/drain electrode 500 for convenience of description. Referring to FIG. 3a (in which the base substrate and the gate insulating layer are omitted), an orthographic projection of the active layer 400 on the base substrate 100 is within an orthographic projection of the gate electrode 200 on the base substrate 100; with reference to FIG. 3b, the source/drain electrode 500 is electrically connected to the data line 700 through the connection electrode 800.

The inventors found through long-term research that with reference to the FFS pixel design in the related art of FIG. 3a and FIG. 3b, when the source/drain electrode 500 is connected to the data line 700 through the connection electrode 800 at a climbing position of the source/drain electrode 500 with respect to the gate electrode 200 at the channel in FFS pixel design, such that the active layer 400 does not go beyond the gate electrode 200, the leakage current generated in the TFT when being illuminated with light may be reduced and at the same time the manufacturing cost will not be increased.

According to the arrangement of the present disclosure, the specific kind of the connection electrode 800 is not particularly limited and can be selected according to use and design of the array substrate by those skilled in the art, as long as the connection electrode 800 formed of such kind of the material has a conductive effect and does not generate leakage current. In some arrangements of the present disclosure, the connection electrode 800 may be formed of an ITO material. Thus, the connection electrode 800 using the above materials can not only electrically connect the source/drain electrode 500 to the data line 700, but also further avoid generating leakage current by itself under illumination.

According to the arrangement of the present disclosure, the specific fabrication method of the connection electrode 800 is not particularly limited, as long as the connection electrode 800 fabricated by the method can realize the electrical connection between the source/drain electrode 500 and the data line 700, and those skilled in the art can make design based on the specific location of the connection electrode 800. In some arrangements of the present disclosure, the connection electrode 800 may be an integrated structure with a pixel electrode of a thin film transistor formed by one patterning method. Thus, the formation of the connection electrode 800 connecting the source/drain electrodes 500 to the data line 700 will not render additional manufacturing cost.

According to the arrangement of the present disclosure, the specific location of the data line 700 is not particularly limited, and those skilled in the art can make design according to the use requirements of the array substrate. In some arrangements of the present disclosure, referring to FIG. 3b, the data line 700 and the source/drain electrode 500 may be disposed in a same layer. As such, the data line 700 and the source/drain electrode 500 can be formed by one patterning process without increasing the cost of fabricating the array substrate. It should be noted that all "in a same layer" in this context refers to being formed by one patterning process or disposed in a same layer structure. In some specific examples of the present disclosure, referring to FIG. 3b, not only the data line 700 and the source/drain electrode 500 may be disposed in the same layer, but also the semiconductor layer at the lower surface of the data line 700 and the active layer 400 may be disposed in the same layer, and thus, the data line 700, the source/drain electrode 500, and the active layer 400 can be fabricated through the same mask, thus contributing to reduction in manufacturing cost. Further, the source electrode and the drain electrode constituting the source/drain electrode 500 are insulated from each other, and the source electrode and the drain electrode are connected to different structures respectively. One of the source electrode and the drain electrode is connected to the data line 700, and the other of the source electrode and the drain electrode is connected to the pixel electrode. In other arrangements of the present disclosure, referring to FIG. 4b, the data line 700 and the gate electrode 200 may be disposed in the same layer. As such, the data line 700 and the gate electrode 200 can be formed by one patterning process, and the thickness of the gate insulating layer 300 at the side of the data line 700 away from the substrate 100 can also be increased, thus reducing parasitic capacitance.

Figure 4A:
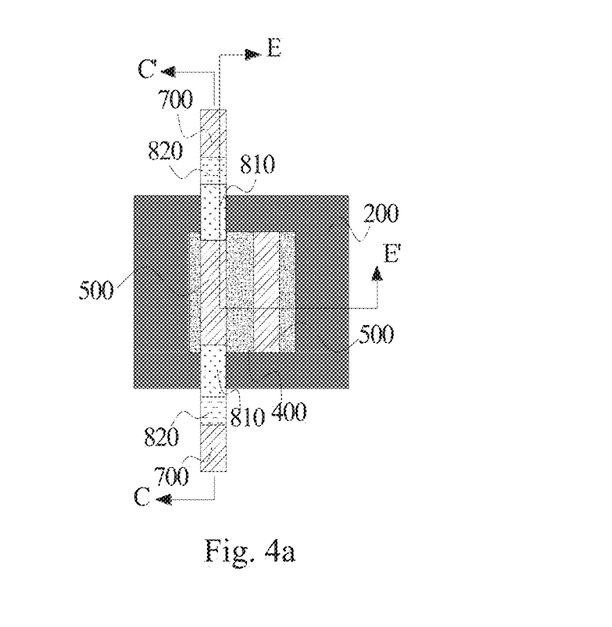
FIG. 4a is a schematic top view of a structure of an array substrate according to another arrangement of the present disclosure.
Figure 4B:
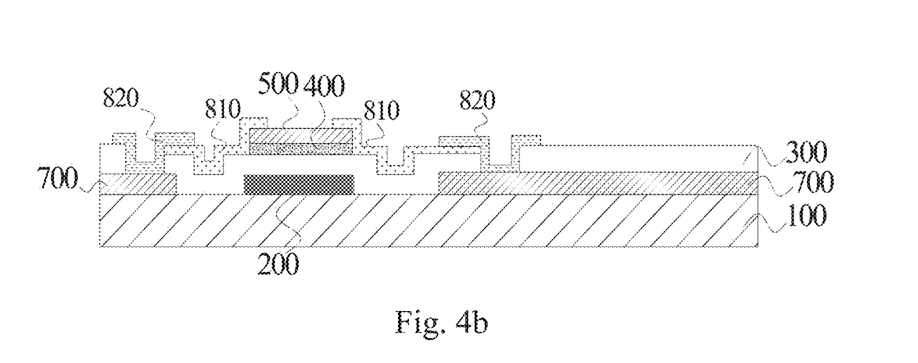
Figure 4C:
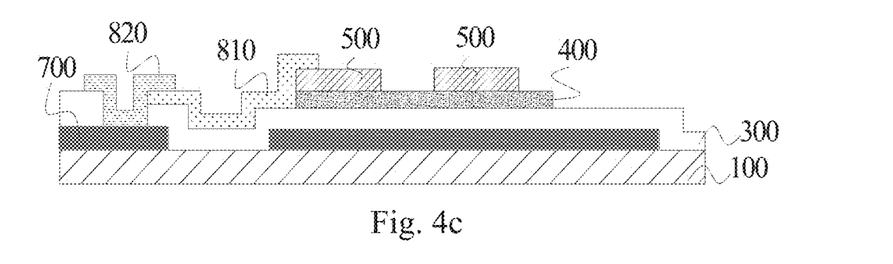

In some arrangements of the present disclosure, referring to FIG. 4b, the connection electrode 800 may further include a first sub-connection electrode 810 and a second sub-connection electrode 820. The first sub-connection electrode 810 is disposed in the same layer as the pixel electrode and electrically connected to the source/drain electrode 500; and the second sub-connection electrode 820 is disposed in the same layer as the common electrode, and is electrically connected to the first sub-connection electrode 810 and the data line 700. As such, the source/drain electrode 500 and the data line 700 can be electrically connected through the first sub-connection electrode 810 and the second sub-connection electrode 820, and the first sub-connection electrode 810 is disposed in the same layer as the pixel electrode, the second sub-connection electrode 820 is disposed in the same layer as the common electrode, so that the manufacturing cost is not increased. In some arrangements of the present disclosure, the connection electrode 800 can also directly connect the source/drain electrode 500 to the data line 700 electrically. Thus, the process of making only one connection electrode 800 is simpler and the manufacturing cost is lower.

Figure 5A:
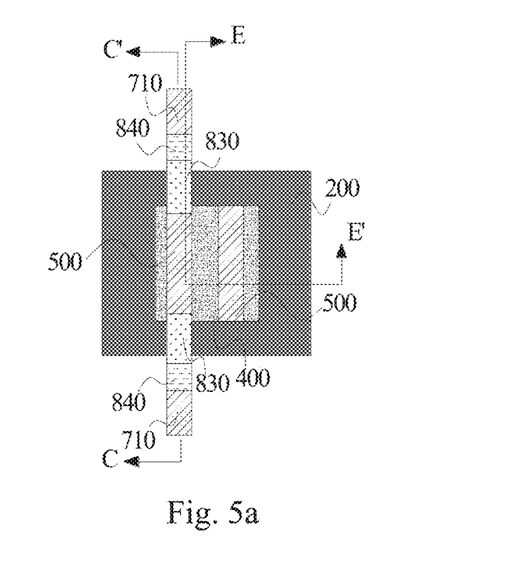
FIG. 5a is a schematic top view of a structure of an array substrate according to another arrangement of the present disclosure.
Figure 5B:
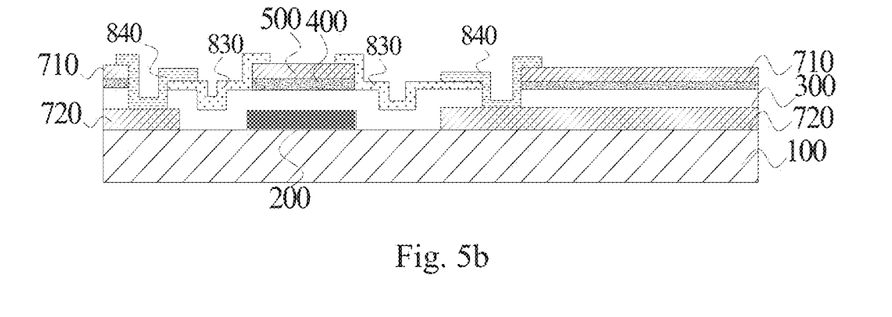
Figure 5C:
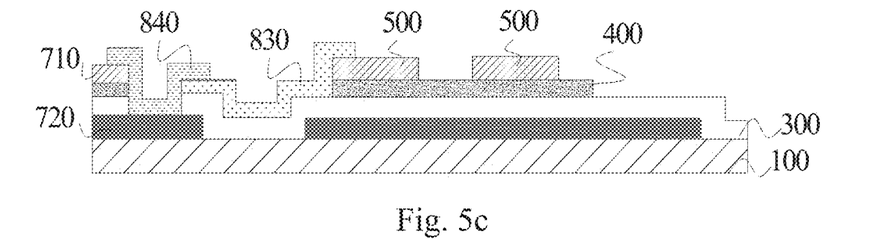
Figure 6A:
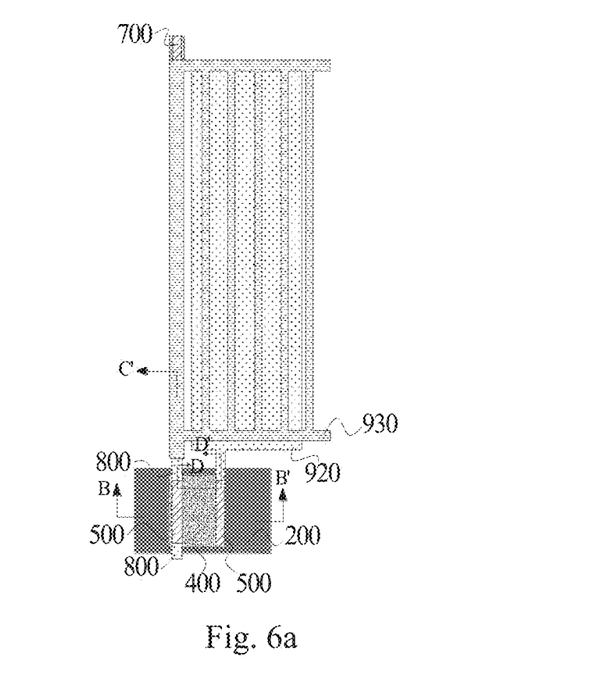
FIG. 6a is a schematic top view of a structure of an array substrate according to another arrangement of the present disclosure.
Figure 6B:
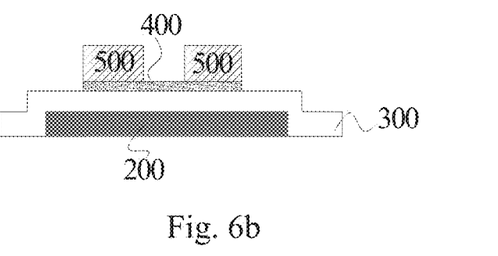
Figure 6C:
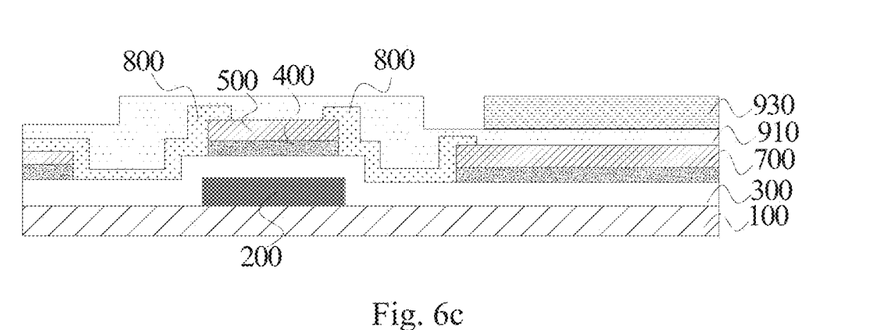
Figure 6D:
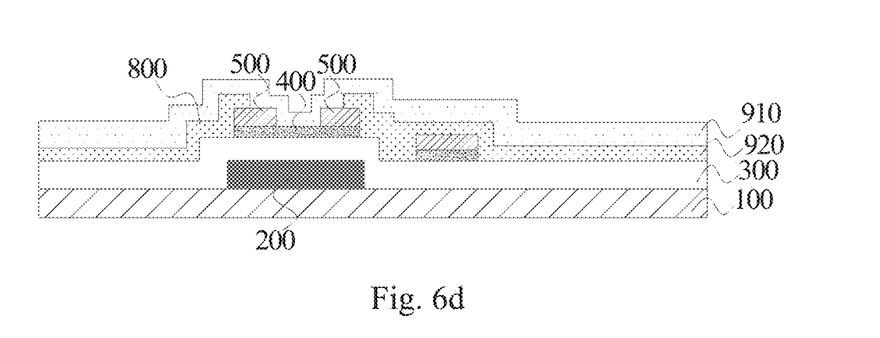
FIG. 6d is a schematic structure view obtained after a U-shaped cross-section taken along line DD' of FIG. 6a is unfolded.
Figure 7A:
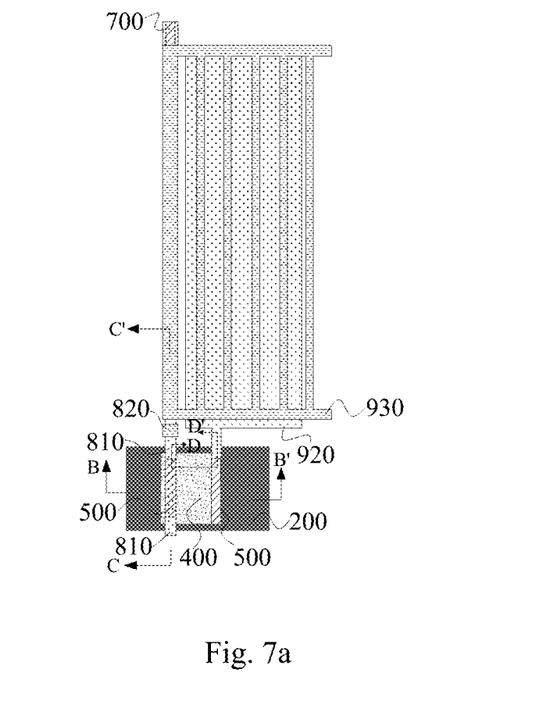
FIG. 7a is a schematic top view of a structure of an array substrate according to another arrangement of the present disclosure.
Figure 7B:
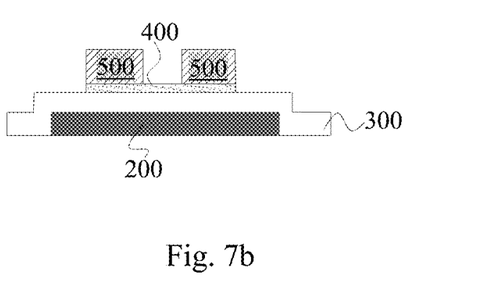
Figure 7C:
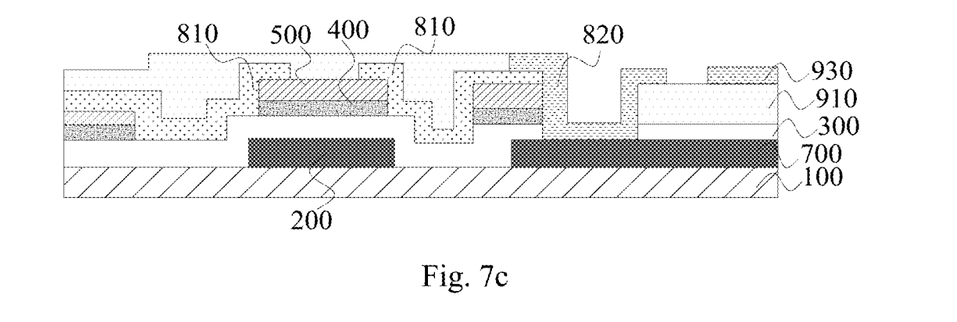
Figure 7D:
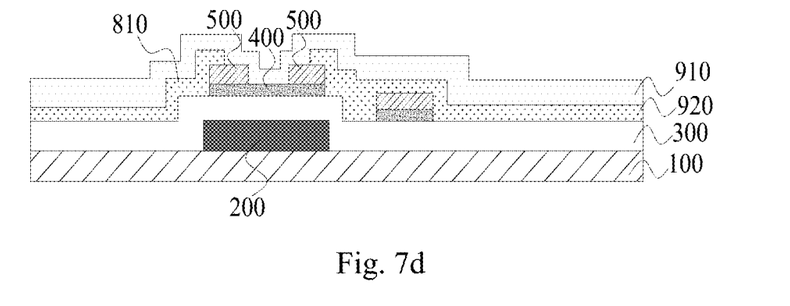
FIG. 7d is a schematic structure view obtained after a U-shaped cross-section taken along line DD' of FIG. 7a is unfolded.
Figure 8A:
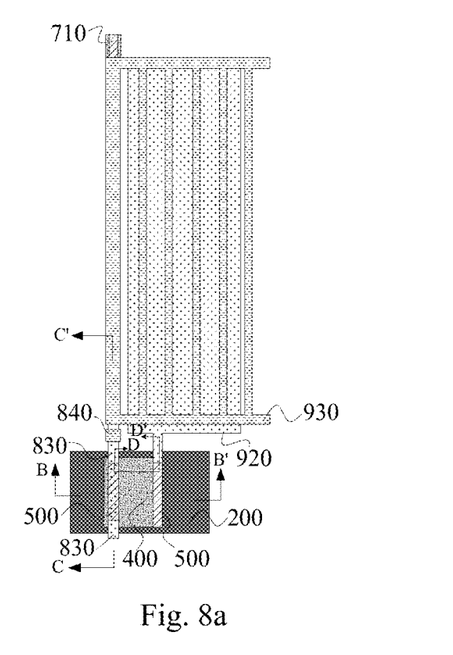
FIG. 8a is a schematic top view of a structure of an array substrate according to another arrangement of the present disclosure.
Figure 8B:
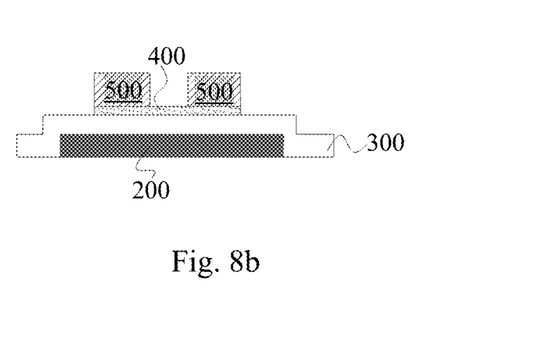
Figure 8C:
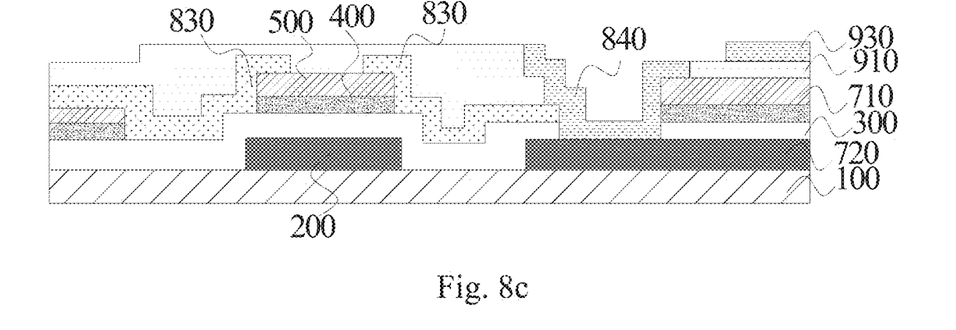
Figure 8D:
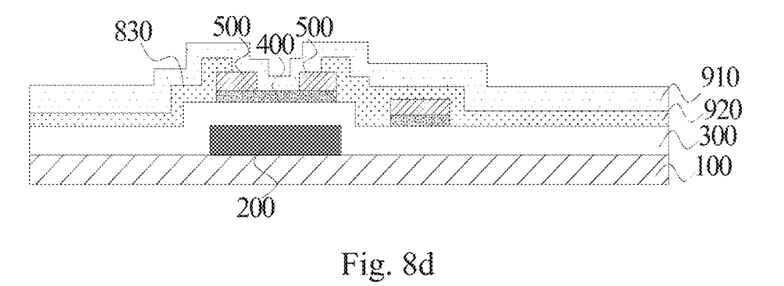
FIG. 8d is a schematic structure view obtained after a U-shaped cross-section taken along line DD' of FIG. 8a is unfolded.

According to an arrangement of the present disclosure, referring to FIG. 5b, the data line 700 may further include a first data line 710 and a second data line 720. The first data line 710 is disposed in the same layer as the source/drain electrode 500; the second data line 720 is disposed in the same layer as the gate electrode 200, and the second data line 720 is electrically connected to the first data line 710 through the connection electrode. As such, the resistance can be reduced by the double data lines 710 and 720 arranged parallelly and connected in parallel.

In other arrangements of the present disclosure, referring to FIG. 5b, the connection electrode 800 (not indicated) may include a third sub-connection electrode 830 and a fourth sub-connection electrode 840. The third sub-connection electrode 830 is disposed in the same layer as the pixel electrode and is electrically connected to the source/drain electrode 500. The fourth sub-connection electrode 840 is disposed in the same layer as the common electrode, and is electrically connected to the third sub-connection electrode 830, the first data line 710, and the second data line 720. Moreover, the first data line 710 and the second data line 720 can be directly connected to each other through the fourth sub-connection electrode 840, so that the two data lines can be connected to each other in parallel and thus the resistance can be reduced. As such, the source/drain electrode 500 can be electrically connected to the first data line 710 and the second data line 720 through the third sub-connection electrode 830 and the fourth sub-connection electrode 840, and the third sub-connection electrode 830 is disposed in the same layer as the pixel electrode and the fourth sub-connection electrode 840 is disposed in the same layer as the common electrode, so that the manufacturing cost is not increased.

According to an arrangement of the present disclosure, referring to FIGS. 6a to 8d, the array substrate may further include an interlayer insulating layer 910, a common electrode 930, and a pixel electrode 920. It should be noted that, FIGS. 3b, 4b, and 5b are all schematic cross-sectional views of the structure of the array substrate along the CC' line, and the base substrate, the gate insulating layer, and the interlayer insulating layer are omitted in the schematic top views of the structure of the array substrate (including FIGS. 3a, 4a, 5a, 6a, 7a and 8a).

In some specific examples of the present disclosure, referring to FIGS. 6a-6d, the data line 700 and the source/drain electrode 500 are disposed in the same layer, and the connection electrode 800 electrically connects the source/drain electrode 500 to the data line 700. The connection electrode 800 and the pixel electrode 920 are disposed in the same layer, the interlayer insulating layer 910 covers the source/drain electrode 500, the connection electrode 800 and the data line 700, and the common electrode 930 covers at least a portion of the interlayer insulating layer 910. As such, the connection electrode 800 in this arrangement may include at least two portions that are insulated from each other, a first portion of the connection electrode 800 is used to electrically connect the source electrode to the data line 700, and another portion of the connection electrode 800 electrically connects the drain electrode to the pixel electrode 920, and the another portion of the connection electrode 800 may be integrally formed with the pixel electrode 920.

In other specific examples of the present disclosure, referring to FIGS. 7a-7d, the data line 700 and the gate electrode 200 are disposed in the same layer, and the first sub-connection electrode 810 and the second sub-connection electrode 820 electrically connect the source/drain electrode 500 to the data line 700. The first sub-connection electrode 810 and the pixel electrode 920 are disposed in the same layer, the second sub-connection electrode 820 and the common electrode 930 are disposed in the same layer, and the interlayer insulating layer 910 covers the source/drain electrode 500 and the first sub-connection electrode 810. As such, the total thickness of the insulating layer between the data line 700 and the pixel electrode 920 (not indicated) in the arrangement is increased, so that the parasitic capacitance can be effectively reduced.

In other specific examples of the present disclosure, referring to FIGS. 8a to 8d, the first data line 710 and the source/drain electrode 500 are disposed in the same layer, the second data line 720 and the gate electrode 200 are disposed in the same layer, and the third sub-connection electrode 830 and the fourth sub-connection electrode 840 electrically connects the source/drain electrode 500 to the first data line 710 and the second data line 720. The third sub-connection electrode 830 and the pixel electrode 920 are disposed in the same layer, the fourth sub-connection electrode 840 and the common electrode 930 are disposed in the same layer, and the interlayer insulating layer 910 covers the source/drain electrode 500, the third sub-connection electrode 830, and the first data line 710. As such, the two data lines 710 and 720 in this arrangement can collectively conduct current, thus reducing electrical resistance.

In summary, according to the arrangements of the present disclosure, an array substrate is provided, in which the projection of the active layer on the gate insulating layer is within the projection of the gate electrode on the gate insulating layer, and the source electrode is connected to the data line through the connection electrode, so that the light-induced electric leakage generated by the active layer going beyond the gate electrode is reduced, thus improving the display stability of the display panel formed of the array substrate.

In a second aspect of the present disclosure, a method of manufacturing an array substrate is provided. The manufacturing method according to an arrangement of the present disclosure will be described in detail with reference to FIGS. 9 to 10. According to an arrangement of the present disclosure, referring to FIG. 9, the method includes the following blocks.

Figure 9:
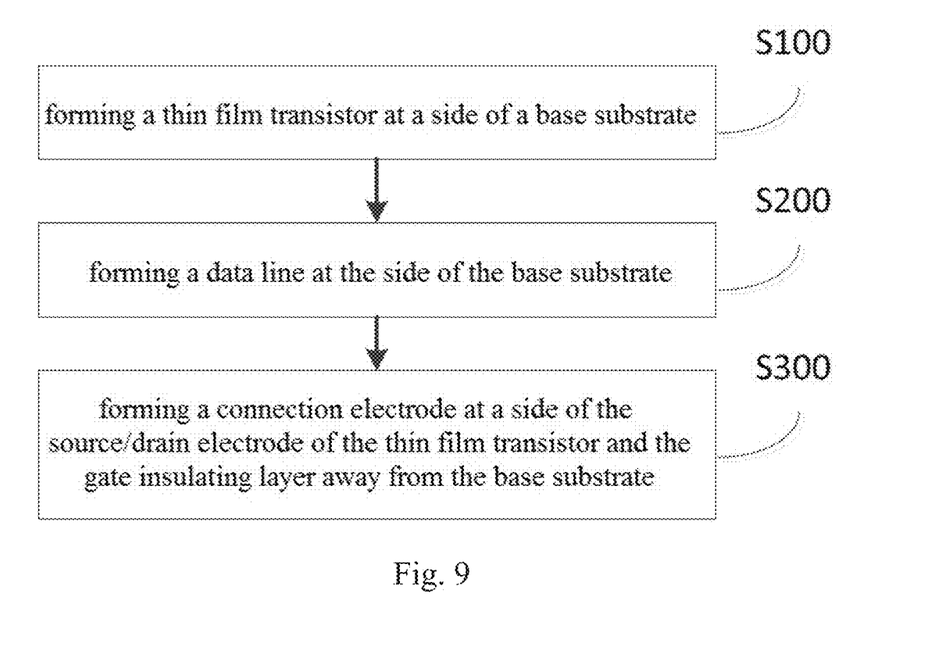
FIG. 9 is a schematic flow chart of a method of manufacturing an array substrate according to an arrangement of the present disclosure.

In block S100, a thin film transistor is formed at a side of a base substrate.

In this block, a thin film transistor is fabricated at a side of a base substrate 100. The thin film transistor may include a gate electrode 200, a gate insulating layer 300, an active layer 400, and a source/drain electrode 500. According to an arrangement of the present disclosure, referring to FIG. 10, the block of forming the thin film transistor may further include blocks S110 and S120, and the blocks S110 and S120 are respectively described below.

Figure 10:
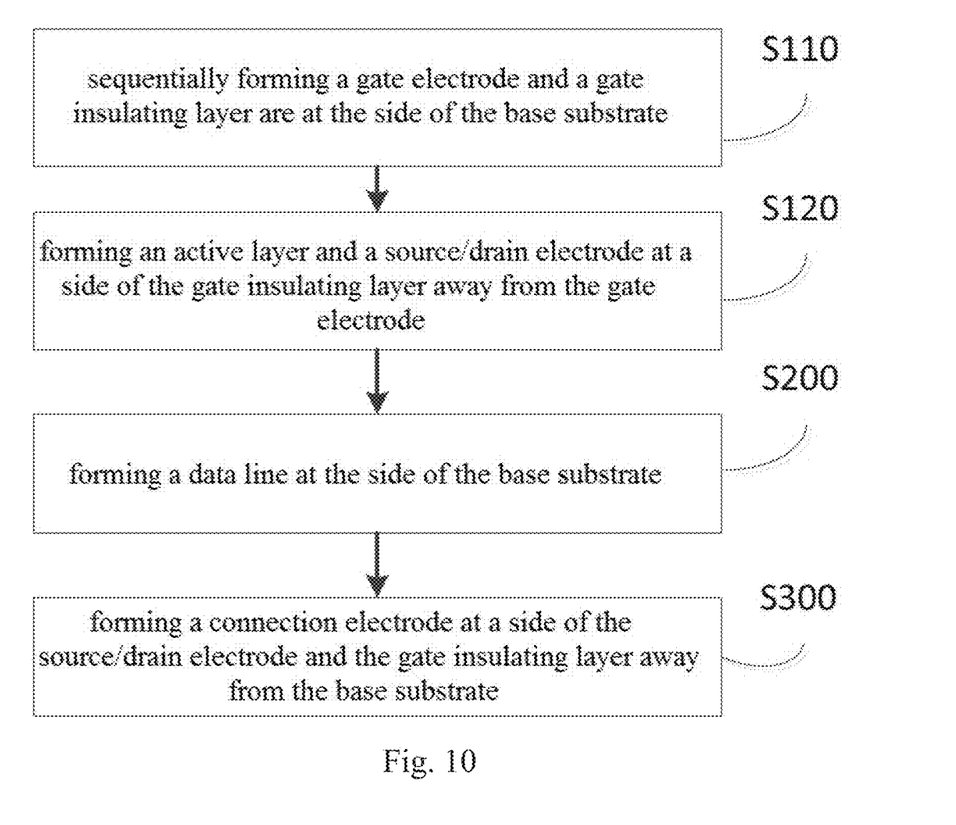
FIG. 10 is a schematic flow chart of a method for manufacturing an array substrate according to another arrangement of the present disclosure.

In block S110, a gate electrode and a gate insulating layer are sequentially formed at the side of the base substrate.

In this block, the gate electrode 200 may be formed at the side of the base substrate 100, and then the gate insulating layer 300 may be formed at the side of the gate electrode 200 away from the base substrate 100 and the same side of the base substrate 100. According to an arrangement of the present disclosure, the specific method of forming the gate electrode 200 and the gate insulating layer 300 is not particularly limited, a method of forming a gate electrode and a gate insulating layer which are commonly used in the art may be used, and those skilled in the art may choose the method according to the actual situation, which will not be described here.

In block S120, an active layer and a source/drain electrode are formed at a side of the gate insulating layer away from the gate electrode.

In this block, the source/electrode 500 and the active layer 400 having the same pattern may be formed at a side of the gate insulating layer 300 away from the gate electrode 200 through the same mask. The projection of the formed active layer 400 on the base substrate 100 falls within the projection of the gate electrode 200 on the base substrate 100. Thus, the active layer 400 formed of the photosensitive material is not outside the gate electrode 200, and no leakage current is generated even when being illuminated with light, thus reducing the technical problem of display abnormality.

According to an arrangement of the present disclosure, the specific method of forming the active layer 400 and the source/drain electrode 500 is not particularly limited, and a method of forming a source/drain electrode and an active layer having the same pattern, which is commonly used in the art, may be employed, for example, HTM MASK and the like may be employed. Those skilled in the art can make selection according to actual situations, and details are not described herein again.

In block S200, a data line is formed at the side of the base substrate.

In this block, a data line 700 is fabricated at the side of the base substrate 100.

In some arrangements of the present disclosure, the data line 700 may be formed along with the gate electrode 200 by one patterning process. Thus, the total thickness of the insulating layer subsequently formed on the surface of the data line 700 is further increased, which contributes to reducing the parasitic capacitance. The data line 700 is formed by using a same mask as the gate electrode 200, which does not increase the manufacturing cost of the array substrate. Further, the gate insulating layer 300 is formed at the side of the gate electrode 200 and the data line 700 away from the base substrate 100 and the same side of the base substrate 100.

In other arrangements of the present disclosure, the data line 700 may also be formed along with the source/drain electrode 500 and active layer 400 by one patterning process. Thus, the data line 700 can be electrically connected to the source/drain electrode 500 through only one layer of connection electrode 800, and the one layer of connection electrode 800 may be formed along with source/drain electrode 500 and the active layer 400 by one mask, which will not increase the manufacturing cost of the array substrate.

In other arrangements of the present disclosure, the data line 700 may include a first data line 710 and a second data line 720. The second data line 720 is formed along with the gate electrode 200 through one patterning process. As such, the two data lines in this design can reduce the resistance. The second data line 720 and the gate electrode 200 are formed by using one mask, which will not increase the manufacturing cost of the array substrate. Further, the gate insulating layer 300 is formed on the side of the gate electrode 200 and the second data line 720 away from the base substrate 100 and the same side of the base substrate 100.

In other arrangements of the present disclosure, the data line 700 may include a first data line 710 and a second data line 720. The first data line 710 may be formed along with the source/drain electrodes 500 and the active layer 400 by one patterning process. As such, the two data lines in this design can reduce the resistance. The first data line 710 is formed along with the source/drain electrode 500 and the active layer 400 by using one mask, which will not increase the manufacturing cost of the array substrate.

In block S300, a connection electrode is formed at a side of the source/drain electrode and the gate insulating layer away from the base substrate.

In this block, in order to solve the problem that the source/drain electrode 500 can not be connected to the data line due to the reduction of the area of the active layer 400, a connection electrode is formed at the side of the source/drain electrode 500, the gate insulating layer 300, and the data line away from the base substrate 100. The connection electrode is used to electrically connect the source/drain electrode 500 to the data line.

According to an arrangement of the present disclosure, a specific method of forming the connection electrode is not particularly limited, and a method of forming an electrode commonly used in the art, such as a method of forming an ITO layer, etc., may be available. Those skilled in the art may make selection according to actual situation, and details are not described herein again.

In some arrangements of the present disclosure, in the case where the data line 700 and the source/drain electrode 500 are formed by one patterning process, the connection electrode 800 may be formed at the side of the source/drain electrode 500, the gate insulating layer 300, and the data line 700 away from the base substrate 100, and thus, the connection electrode 800 may electrically connect the data line 700 and the source/drain electrode 500 disposed in the same layer.

In other arrangements of the present disclosure, in the case where the data line 700 and the gate electrode 200 are formed by one patterning process, the first sub-connection electrode 810 is formed at the side of the source/drain electrode 500 and the gate insulating layer 300 away from the base substrate 100, and the first sub-connection electrode 810 may be formed along with the pixel electrode by one patterning process for electrical connection with the source/drain electrode 500. Then, the second sub-connection electrode 820 is formed at the side of the first sub-connection electrode 810 and the data line 700 away from the base substrate 100, and the second sub-connection electrode 820 may be formed along with the common electrode by one patterning process to be electrically connected to the first sub-connection electrode 810 and the data line 700. As such, even if the data line 700 is not disposed in the same layer as the source/drain electrode 500, the data line 700 and the source/drain electrode 500 can be electrically connected to each other through the first sub-connection electrode 810 and the second sub-connection electrode 820.

In still other arrangements of the present disclosure, in the case where the data line 700 includes the first data line 710 and the second data line 720, the third sub-connection electrode 830 is formed at the side of the source/drain electrode 500 and the gate insulating layer 300 away from the base substrate 100, and the third sub-connection electrode 830 may be formed along with the pixel electrode by one patterning process for electrical connection with the source/drain electrode 500. Then, the fourth sub-connection electrode 840 is formed at the side of the third sub-connection electrode 830, the first data line 710 and the second data line 720 away from the base substrate 100, and the fourth sub-connection electrode 840 can be formed along with the common electrode by one patterning process to electrically connect the third sub-connection electrode 810 to the first data line 710 and the second data line 720 respectively. Thus, even if the two data lines in this design are used, the source/drain electrode 500 can be electrically connected to the two data lines through the third sub-connection electrode 830 and the fourth sub-connection electrode 840.

In summary, according to an arrangement of the present disclosure, a manufacturing method is provided. The obtained array substrate uses a connection electrode to connect a source electrode to a data line, thus reducing light-induced electric leakage due to that the active layer under the source electrode is outside the gate electrode, which in turn improves the display stability of the display including the array substrate. Further, the method does not increase the number of MASKs and the cost of manufacturing the array substrate.

In a third aspect of the present disclosure, a display panel is provided. According to an arrangement of the present disclosure, the display panel includes the above array substrate.

According to an arrangement of the present disclosure, the specific type of the display panel is not particularly limited, and various types of display panels commonly used in the art may be used, such as a television, a mobile phone, a computer display, a flat panel display, a game machine, and a wearable device and the household and domestic appliance having the display panel and the like. Those skilled in the art can make selection according to the actual use requirements of the display panel, and details are not described herein again.

It should be noted that, in addition to the array substrate, the display panel includes other necessary components. Taking a liquid crystal display as an example, it specially further includes for example a color film substrate, a liquid crystal display layer, a light source component, a control component, a circuit and a housing, etc. Those skilled in the art can make supplement according to the specific type of the array substrate, and details are not described herein again.

In summary, according to an arrangement of the present disclosure, a display panel is provided, and the array substrate thereof solves the problem of light-induced electric leakage caused by the active layer outside the gate electrode, thus improving the display stability of the display panel. And its manufacturing costs will not be increased. Those skilled in the art can understand that the features and advantages described above for the array substrate are still applicable to the display panel, and details are not described herein again.

In the description of the present disclosure, it is to be understood that the orientation or positional relationship indicated by the terms "center", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", etc. is based on the orientation or positional relationship shown in the drawings, and is merely for the convenience of describing the present disclosure and the simplified description, rather than indicating or implying that the device or component must have a particular orientation and construct and operate in a particular orientation, and thus is not to be understood as limit of the disclosure.

In the description of the present disclosure, unless otherwise expressly stated and defined, the terms "mounted", "coupled", "connected", "fixed" and the like, are to be understood broadly, for example, it may be fixed connection, removable connection or integrated connection; it may be mechanical connection or electrical connection; it may be direct connection or indirect connection through an intermediate medium; it may be connection of inner portions of two elements or interaction of the two elements. For those ordinary skilled in the art, the specific meanings of the above terms in the present disclosure can be understood based on specific conditions.

Moreover, the terms "first", "second", "third", "fourth" are used for descriptive purposes only, and are not to be understood as indicating or implying a relative importance or implicitly indicating the number of technical features indicated. Thus, features defined with "first", "second", "third", "fourth" may include at least one of the features, either explicitly or implicitly. In the description of the present disclosure, the meaning of "a plurality" is at least two, such as two, three, etc., unless specifically defined otherwise.

In the description of the present specification, the description with reference to the terms "one arrangement", "some arrangements", "example", "specific example", or "some examples" and the like means a specific feature, structure, material, or characteristic described with reference to the arrangement or example is included in at least one arrangement or example of the present disclosure. In the present specification, the schematic representation of the above terms is not necessarily directed to the same arrangement or example. Furthermore, the particular features, structures, materials, or characteristics described may be combined in a suitable manner in any one or more arrangements or examples. In addition, in the absence of contradiction, those skilled in the art can combine the different arrangements or examples described in the specification and the features of different arrangements or examples.

While the arrangements of the present disclosure have been shown and described above, it is understood that the above-described arrangements are illustrative and are not to be construed as limiting the present disclosure, variations, modifications, alterations and transformation of the above-described arrangements may be made by those skilled in the art within the scope of the present disclosure.

What is claimed is:

1. An array substrate, comprising:
   a base substrate;
   a thin film transistor, disposed at a side of the base substrate and comprising a first electrode, a second electrode, and a gate electrode;
   a data line, disposed at the side of the base substrate; and
   a connection electrode, electrically connecting the first electrode of the thin film transistor to the data line,
   wherein an orthographic projection of an active layer of the thin film transistor on the base substrate is located within an orthographic projection of the gate electrode of the thin film transistor on the base substrate,
   wherein the data line comprises:
   a first data line, disposed in a same layer as the first electrode and the second electrode of the thin film transistor; and
   a second data line, disposed in a same layer as the gate electrode of the thin film transitor, and electrically connected to the first data line through the connection electrode.

2. The array substrate according to claim 1, wherein the connection electrode is formed of ITO material.

3. The array substrate according to claim 1, wherein the connection electrode comprises:
   a third sub-connection electrode, disposed in a same layer as a pixel electrode, and electrically connected to the first electrode of the thin film transistor; and
   a fourth sub-connection electrode, disposed in a same layer as a common electrode, and electrically connected to the third sub-connection electrode, the first data line, and the second data line.

4. A display panel, comprising an array substrate, wherein the array substrate comprises:
   a base substrate;
   a thin film transistor, disposed at a side of the base substrate and comprising a first electrode, a second electrode, and a gate electrode;
   a data line, disposed at the side of the base substrate; and
   a connection electrode, electrically connecting the first electrode of the thin film transistor to the data line,
   wherein an orthographic projection of an active layer of the thin film transistor on the base substrate is located within an orthographic projection of the gate electrode of the thin film transistor on the base substrate,
   wherein the data line comprises:
   a first data line, disposed in a same layer as the first electrode and the second electrode of the thin film transistor; and a second data line, disposed in a same layer as the gate electrode of the thin film transitor, and electrically connected to the first data line through the connection electrode.

5. The display panel according to claim 4, wherein the connection electrode is formed of ITO material.

6. The display panel according to claim 4, wherein the connection electrode comprises:
   a third sub-connection electrode, disposed in a same layer as a pixel electrode, and electrically connected to the first electrode of the thin film transistor; and
   a fourth sub-connection electrode, disposed in a same layer as a common electrode, and electrically connected to the third sub-connection electrode, the first data line, and the second data line.

\* \* \* \* \*